March 12, 1963 C. J. BEUSCHER 3,081,203

METHOD OF REMOVING HARDENED PHOTORESIST MATERIAL
FROM PRINTED CIRCUIT CONDUCTORS

Filed May 26, 1960

Inventor:
Clinton J. Beuscher,
by Gust & Irish
Attorneys.

United States Patent Office 3,081,203

Patented Mar. 12, 1963

3,081,203

METHOD OF REMOVING HARDENED PHOTORESIST MATERIAL FROM PRINTED CIRCUIT CONDUCTORS

Clinton J. Beuscher, Fort Wayne, Ind., assignor to International Telephone and Telegraph Corporation Filed May 26, 1960, Ser. No. 31,908

1 Claim. (Cl. 134—28)

Figure 1:
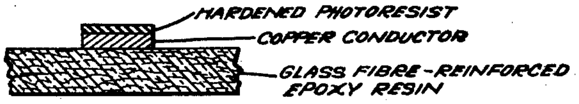

This invention relates generally to methods of making printed circuit boards, and more particularly to a method of removing hardened photoresist from the surface of the copper conductor of a printed circuit board to permit application of a thin coating of a metal which will displace copper, such as gold.

In accordance with a conventional method of making printed circuit boards, a relatively thin board is provided formed of epoxy resin reinforced with glass fibers and having a thin layer of copper deposited on either or both sides. A photoresist emulsion purchased from the Eastman Kodak Company, Rochester, New York, and identified as "KPR" is applied on the surface of the copper layer by dipping and is then dried in an oven in darkness. This photoresist material is photosensitive and the desired circuit arrangement is "printed" thereon by applying a photographic negative of the circuit to the surface and exposing the board with the negative thereon to light; on the negative, the conductive elements appear as light lines whereas the remaining portions are dark. As a result of this exposure to light, portions of the photoresist surface on which the light has impinged, i.e., the parts which ultimately are to form the conductive elements, harden. The exposed board is then placed in a developing solution which washes away that part of the photoresist material which has not hardened. The board is then placed in an etching tank in which the portions of the copper surface which are not covered by the hardened photoresist material are etched away with ferric chloride.

The copper conductors on the printed circuit board provided by the above-described method have a thin surface coating of hardened photoresist material which is hard, scaly, and adheres tenaciously to the conductor. Due to the presence of this hardened photoresist material, it is difficult to make soldered connections directly to the copper conductors. It has been found desirable to apply a thin coating of gold on the surface of the copper conductors in order to provide better electrical contact, to inhibit corrosion of the conductors, and to provide greater solderability. However, a gold coating cannot be directly applied to such printed circuit boards due to the presence of the hardened photoresist coating on the conductors. In the past, this hardened photoresist coating has been physicaly removed by abrading with steel wool and/or wire brushes. However, such prior manual methods not only are time consuming and thus expensive, but further, in the case of steel wool, small fragments tend to rip off and to become caught or snagged on the conductors, thus short circuiting the same, and in the case of wire brushes, unless great care is exercised, there is a tendency for the conductors to be physically ripped off of the board. It is therefore desirable to provide a chemical dip process applicable to quantity production for removing the hardened photoresist material from the surface of the copper conductors of a printed circuit board; quite obviously, the hardened photoresist material cannot be removed by conventional etchants since its basic purpose is to resist acid etching in order to form the basic printed circuit board. Furthermore, no commercially available solvent has been found which will dissolve the KPR photoresist material, the constituents of which are not presently known. I have discovered, however, that the hardened photoresist material can be removed by applying thereto a material which converts the photoresist into a gelatinous substance to which another material is applied for hardening the same, causing it to separate from the surface of the conductor. The hardened gelatinous material is then removed by flotation following which the conductors are subjected to a mild acid etch preparatory to application of the gold coating by a gold immersion dip.

It is accordingly an object of my invention to provide a method of removing hardened photoresist material from the surface of a printed circuit board conductor.

Figure 2:
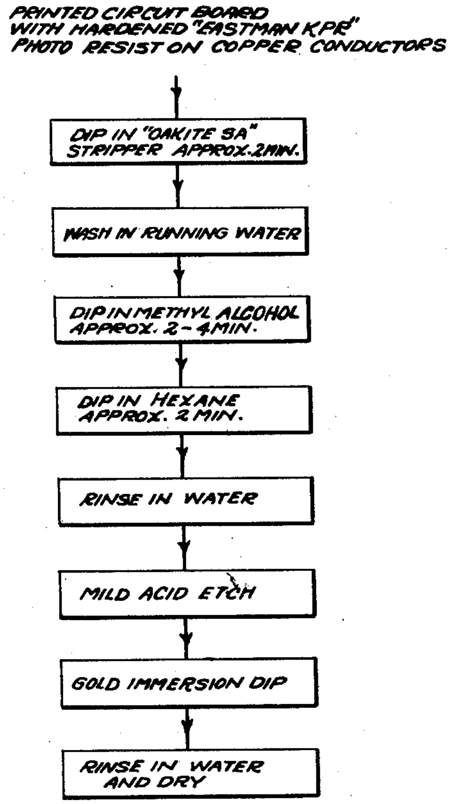

The above-mentioned and other features and objects of this invention and the manner of attaining them will become more apparent and the invention itself will be best understood by reference to the following description of an embodiment of the invention taken in conjunction with the accompanying drawings, wherein:

FIG. 1 is a fragmentary cross-sectional view showing a printed circuit board with a copper conductor thereon having its surface coated with hardened photoresist material; and FIG. 2 diagrammatically shows the steps in the method of my invention.

In accordance with my invention, I dip the printed circuit board as described above for approximately two minutes in a liquid stripping material sold by the Oakite Manufacturing Company under the identification "SA," the stripping material being at room temperature. The Oakite "SA" stripper has a density of about 1.3 and a pH of about 1.0. The Oakite "SA" stripper is a solvent-acid paint remover consisting of a balanced mixture of various solvents including a chlorinated hydrocarbon with a non-ionic ether surface wetting agent, an evaporation retardant including a hydrocarbon type wax, and an organic acid including formic acid having a pH of 2 to 2½. This dipping of the printed circuit board in the Oakite SA stripper converts the hardened KPR photoresist material into a gelatinous substance. As previously indicated, the constituents of the Eastman KPR photoresist material are not known, however, it is well known that egg albumen was commonly used for many years as a photoresist material in the photoengraving art. Egg albumen is, of course, organic, with a high portein content, which would thus account for its tenacious adherence to the surface upon which it is applied. The Eastman KPR photoresist material is known to be organic, and I thus hypothesize that like egg albumen, it has a high protein content; I attribute the jelling of the hardened KPR photoresist material when dipped in the Oakite SA stripper to the high protein content of the Eastman KPR photoresist material. I have found that if the board is left in the Oakite SA stripper for more than three minutes, deterioration of the epoxy-glass board results; no deterioration is observed, however, following the two minute dip.

Following dipping of the board in the Oakite SA stripper, the board is washed in running water or dipped in a running water tank which removes some larger globules of the gelatinized material, it being pointed out, however, that the gelatinous material is not water soluble.

The board is then dipped in methyl alcohol ($CH_3OH$, technical grade) at room temperature for approximately two minutes to four minutes, which hardens the gelatinous photoresist material. It appears that during this dipping operation, some of the methyl alcohol works underneath the gelatinous coating so that when the coating hardens, it is caused to peel away or separate from the surface of the conductor. As a result of this dipping of the board in methyl alcohol, the gelatinous coating on the conductors changes from essentially transparent to a milky color. At the end of this methyl alcohol dip, much of the hardened gelatinous material is hanging rather loosely on the surface of the conductors and some of the hardened material floats off.

The board is then dipped in hexane ($C_6H_{14}$) which is a thinner liquid having a specific gravity of .66, and which does not attack the epoxy-glass board, the hexane being at room temperature. The hexane removes substantially all of the remaining hardened gelatinous material by flotation.

It may be found desirable to then dip the board in a chelating agent at 165° to 185° F., such as a material manufactured by the Oakite Manufacturing Company and identified as "62," or a five to ten percent aerosol solution; however, I have found that the chelating agent dip is not generally necessary for satisfactory results.

With the method described above, I have found that eighty to ninety percent of the boards treated as described above will have substantially all of the Eastmen KPR photoresist material removed from the surface of the copper conductors. In the event that some residue of photoresist material remains on the conductors following the above-described treatment, the board can be subjected to a second treatment with the respective dip times cut in half.

In order to apply a thin coating of gold to the copper conductors following removal of the hardened KPR photoresist material as described above, the board is given a water rinse, followed by a mild acid etch at room temperature. For this etching, I have employed a thirty percent solution of an acid manufactured by McDermid, Inc., Waterbury, Connecticut, and identified as "L5," the board being subjected to the McDermid L5 for approximately two minutes. I have also employed for the mild etching a mixture of approximately fifty percent (50%) phosphoric acid ($H_3PO_4$), twenty percent (20%) sulphuric acid ($H_2SO_4$), ten percent (10%) nitric acid ($HNO_3$), and twenty percent (20%) water, the board being dipped therein for fifteen to twenty seconds.

Following the mild acid etch, the board is again washed in water and the gold coating is applied by a gold immersion dip. Here I have employed a liquid gold displacement material comprising a solution of approximately three-quarters ounce to the gallon of forty-one percent (41%) gold potassium cyanide ($KAu(CN)_2.2H_2O$), four ounces to the gallon of sodium cyanide ($NaCN$) and five ounces to the gallon of sodium carbonate ($Na_2CO_3$). I have employed this aqueous solution at a temperature from 60° to 65° C., with the board being dipped therein for a period of thirty (30) seconds to one (1) minute, to thereby apply a gold coating approximately .000001–.000003 inch thick. It is well understood that with such a gold immersion dip, that the gold is deposited on the conductor by displacement, i.e., the gold displacing copper on the surface, with the copper going into the solution.

The board is then given another water rinse and dried to complete the method of my invention.

In production, the above chemical dip process for removing the hardened Eastman KPR photoresist material from the copper conductors has been found to be fifteen to twenty times faster than the prior methods of removal of the hardened photoresist material by hard scrubbing with detergents, steel wool, and/or wire brushes.

I have found that for best results, it is necessary that the specific gravities of the several chemical dips employed in practicing my invention be closely controlled. Thus, I have found that the specific gravity of the Oakite SA stripper should be maintained between 1.240 and 1.320, the specific gravity of the methyl alcohol should be maintained between .800 and .850, the specific gravity of the hexane should be maintained between .660 and .700, the percentage of McDermid L5 solution should be maintained between 25% and 35% and the cyanide content of the gold immersion dip should be maintained between 1.25 and 2.25 ounces per gallon.

While I have described above the principles of my invention in connection with specific methods, it is to be clearly understood that this description is made only by way of example and not as a limitation to the scope of my invention.

What is claimed is:

The method of removing hardened photoresist material from the surface of a conductor of a printed circuit board comprising the steps of:

dipping said board in a solvent-acid paint remover consisting of a balanced mixture of various solvents including a chlorinated hydrocarbon with a non-ionic ether surface wetting agent, an evaporation retardant including a hydrocarbon type wax, and an organic acid including formic acid at room temperature for approximately two minutes to render said photoresist material gelatinous;

dipping said board in methyl alcohol at room temperature for approximately two to four minutes to harden said gelatinous photoresist material and to separate the same from said conductor; and dipping said board in hexane at room temperature for approximately two minutes to remove said hardened gelatinous photoresist material by flotation.

References Cited in the file of this patent

UNITED STATES PATENTS

| | | |
|---|---|---|
| 2,338,673 | Slack | Jan. 4, 1944 |
| 2,417,468 | Canziani | Mar. 18, 1947 |
| 2,435,239 | Schub | Feb. 3, 1948 |
| 2,709,666 | Speekman | May 31, 1955 |
| 2,737,465 | Pessel | Mar. 6, 1956 |
| 2,925,332 | Standley | Feb. 16, 1960 |